United States Patent
Hirose

(10) Patent No.: US 10,615,788 B2
(45) Date of Patent: Apr. 7, 2020

(54) VARIABLE CAPACITANCE PROTECTION CIRCUIT OF A CIRCUIT ELEMENT, AMPLIFIER, AND SWITCHING POWER SUPPLY APPARATUS

(71) Applicant: FUJITSU LIMITED, Kawasaki-shi, Kanagawa (JP)

(72) Inventor: Tatsuya Hirose, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/810,446

(22) Filed: Nov. 13, 2017

(65) Prior Publication Data

US 2018/0159313 A1    Jun. 7, 2018

(30) Foreign Application Priority Data

Dec. 7, 2016  (JP) .................................. 2016-237224

(51) Int. Cl.
  *H03K 17/081* (2006.01)
  *H02M 1/32* (2007.01)
(52) U.S. Cl.
  CPC ........ *H03K 17/08104* (2013.01); *H02M 1/32* (2013.01)
(58) Field of Classification Search
  CPC ..... G05F 1/571; H02M 1/32; H03K 17/08104
  See application file for complete search history.

(56) References Cited

U.S. PATENT DOCUMENTS

| | | | |
|---|---|---|---|
| 4,605,999 A | 8/1986 | Bowman | |
| 4,950,961 A | 8/1990 | Zaslavsky | |
| 6,535,545 B1 * | 3/2003 | Ben-Bassat | ........ H04B 1/70712 375/142 |
| 2008/0291711 A1 | 11/2008 | Williams | |

(Continued)

FOREIGN PATENT DOCUMENTS

| | | |
|---|---|---|
| EP | 2197111 A1 | 6/2010 |
| JP | H9-69766 A | 3/1997 |
| JP | 2008-113547 A | 5/2008 |

(Continued)

OTHER PUBLICATIONS

Office Action pursuant to Article 94(3) EPC of European Patent Application No. 17202894.6 dated Nov. 27, 2019 (6 sheets).

(Continued)

*Primary Examiner* — Kyle J Moody
*Assistant Examiner* — Peter M Novak
(74) *Attorney, Agent, or Firm* — Kratz, Quintos & Hanson, LLP

(57) ABSTRACT

A protective circuit includes a first capacitance element and a second capacitance element. A first capacitance value of the first capacitance element increases with an increase in a voltage applied to a first terminal of a circuit element. The second capacitance element is connected in series with the first capacitance element between the first terminal and a second terminal which is a reference potential terminal. The second capacitance element has a second fixed capacitance value which is larger than the first capacitance value until the (Continued)

voltage reaches a first value. The second capacitance element has a breakdown voltage characteristic higher than a breakdown voltage characteristic of the circuit element.

5 Claims, 16 Drawing Sheets

(56) References Cited

U.S. PATENT DOCUMENTS

2015/0084538 A1    3/2015    Yang

FOREIGN PATENT DOCUMENTS

| TW | 307058 B | 6/1997 |
|----|----------|--------|
| TW | 200901612 A | 1/2009 |
| WO | 2014061114 A1 | 4/2014 |

OTHER PUBLICATIONS

Office Action Examination Report issued by Taiwan Patent Office in corresponding Taiwan Application No. 106142182 dated Sep. 28, 2018 (6 pages, 4 pages translation, 10 pages total).

Extended European Search Report for corresponding European Application No. 17202894.6, dated Apr. 25, 2018 (8 Sheets).

\* cited by examiner

VARIABLE CAPACITANCE PROTECTION CIRCUIT OF A CIRCUIT ELEMENT, AMPLIFIER, AND SWITCHING POWER SUPPLY APPARATUS

CROSS-REFERENCE TO RELATED APPLICATION

This application is based upon and claims the benefit of priority of the prior Japanese Patent Application No. 2016-237224, filed on Dec. 7, 2016, the entire contents of which are incorporated herein by reference.

FIELD

The embodiments discussed herein are related to a protective circuit, an amplifier, and a switching power supply apparatus.

BACKGROUND

In recent years energy saving and miniaturization have been promoted in various fields. The fields of, for example, high-frequency radio communication devices represented by portable telephones and power supply apparatus are also influenced by them.

With a switching power supply apparatus driven at a high voltage, for example, a high breakdown voltage switching element with low loss whose switching frequency may be increased is proposed. Furthermore, with a high power amplifier for high-frequency radio communication the use of a transistor (amplifier element) which operates at high frequencies is also proposed in order to increase a maximum oscillation frequency. A transistor using a compound semiconductor, such as gallium nitride (GaN), whose on-state resistance is small or a silicon(Si) metal-oxide-semiconductor(MOS) transistor in which gate length is shortened is proposed as such a switching element or an amplifier element. Hereinafter a transistor using GaN and an Si-MOS transistor in which gate length is shortened will be referred to as a GaN transistor and a short-gate-length Si-MOS transistor respectively.

With a GaN transistor or a short-gate-length Si-MOS transistor, however, there is an upper limit to voltage applied to a gate portion which controls current (breakdown voltage of the gate portion). This upper limit is low compared with an ordinary MOS transistor. If voltage applied to the gate portion exceeds the upper limit, the gate portion may be destroyed.

In order to solve the problem of destruction of a circuit element by an overvoltage, formerly a Zener diode was connected to a terminal of a circuit element to be protected. If a voltage higher than or equal to a Zener voltage is applied to a Zener diode, a current flows through the Zener diode and a voltage higher than or equal to the Zener voltage is not applied to the terminal of the circuit element to be protected.

See, for example, Japanese Laid-open Patent Publication Nos. 09-69766 and 2008-113547.

However, if a Zener diode is used as a protective circuit for protecting a circuit element against an overvoltage, a power loss occurs because of a resistance component of the Zener diode when a current flows through the Zener diode.

SUMMARY

According to an aspect, there is provided a protective circuit including a first capacitance element whose first capacitance value increases with an increase in a first voltage applied to a first terminal of a circuit element and a second capacitance element connected in series with the first capacitance element between the first terminal and a second terminal which is a reference potential terminal, having a second fixed capacitance value which is larger than the first capacitance value until the first voltage reaches a first value, and having a breakdown voltage characteristic higher than a breakdown voltage characteristic of the circuit element.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
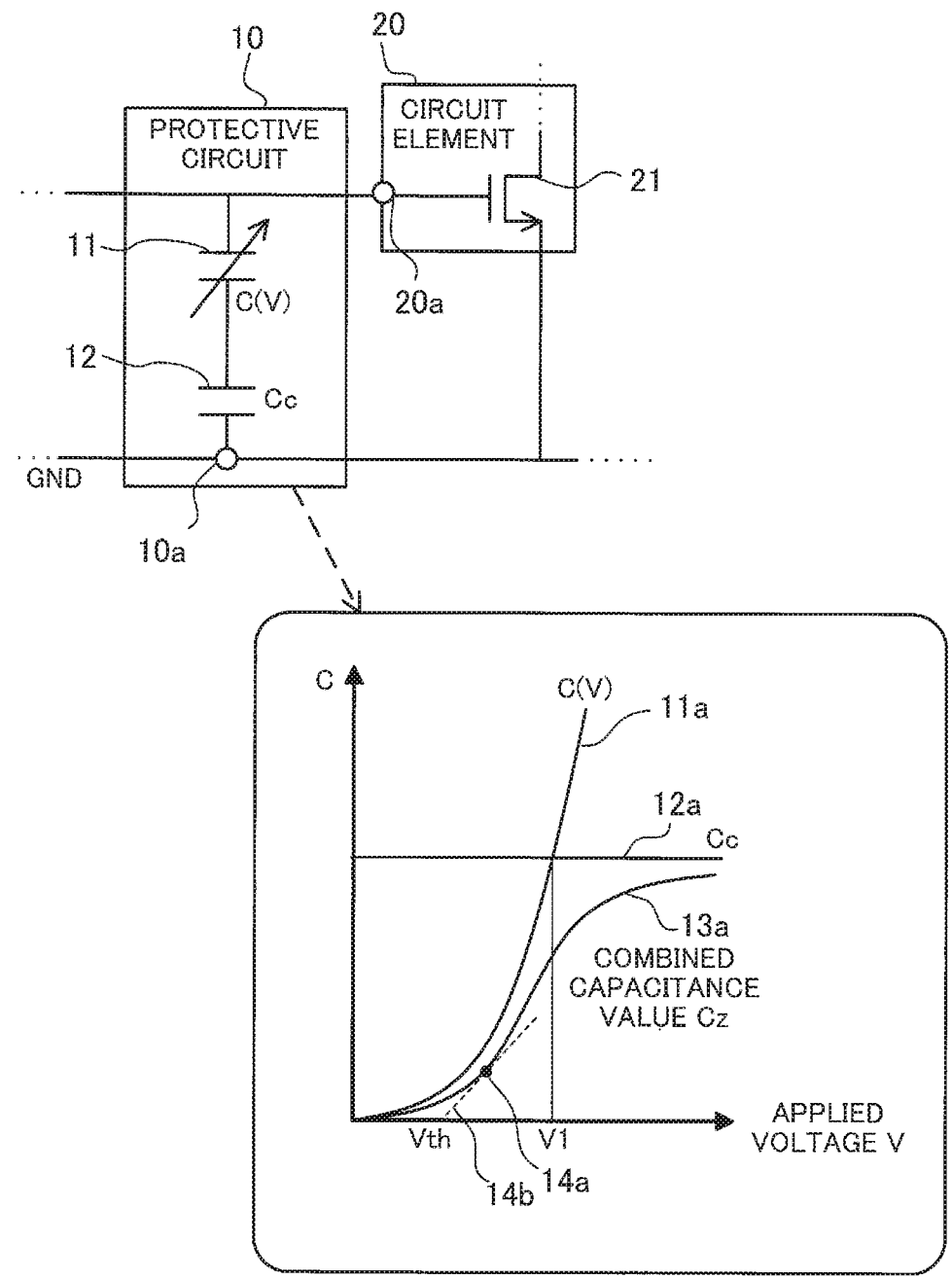
FIG. 1 illustrates an example of a protective circuit according to a first embodiment.

Embodiments will now be described with reference to the accompanying drawings, wherein like reference numerals refer to like elements throughout.

(First Embodiment)

FIG. 1 illustrates an example of a protective circuit according to a first embodiment.

A protective circuit 10 protects a circuit element 20 against an overvoltage. In the example of FIG. 1, an n-channel field effect transistor (FET) 21, which is the above short-gate-length Si-MOS transistor or the like, is illustrated as the circuit element 20.

There is a capacitance in the inside between a gate terminal and a drain terminal of the FET 21. If a drain voltage higher than an upper limit is applied to the gate terminal via the capacitance, then a gate portion reaches a breakdown voltage limit and is destroyed. Furthermore, assuming that the FET 21 is a switching element included in a switching power supply apparatus, a control circuit which controls the FET 21 so as to make an output voltage constant may be developed on the premise that an Si-MOS transistor for power control is used as the FET 21. Therefore, the range of an output voltage of the control circuit is wider than the range of voltages which a gate portion of a GaN transistor or a short-gate-length Si-MOS transistor withstands, and the gate portion may be destroyed.

As the frequency of transistor operation increases, it is expected in the future that the range of voltages applied to a gate terminal for current or voltage control will become narrower. On the other hand, a drain voltage in a switching power supply apparatus or a high-frequency power amplifier increases for increasing the efficiency of power conversion operation. The reason for this is as follows. If a large power is generated by a low voltage and a large current, heat is generated because of a resistance component of a metal wiring through which a current runs, and loss occurs. However, if the same power is generated by a high voltage and a small current, loss caused by the resistance component of the metal wiring is reduced. Furthermore, as stated above, a high voltage leads to a small current. As a result, the cross-sectional area of a wiring is reduced. This has the merits of miniaturization and light weight.

The protective circuit 10 according to the first embodiment protects not only the gate portion of the above FET 21 but also the circuit element 20 to which an overvoltage may be applied.

The protective circuit 10 includes capacitance elements 11 and 12 connected in series between a terminal 20a of the circuit element 20 (gate terminal of the FET 21) to which a voltage V is applied and a terminal (GND terminal) 10a which is a reference potential terminal. In the example of FIG. 1, one terminal of the capacitance element 11 is connected to the terminal 20a and the other terminal of the capacitance element 11 is connected to one terminal of the capacitance element 12. In addition, the other terminal of the capacitance element 12 is connected to the terminal 10a. The reference potential is, for example, fixed at 0 V (ground potential). However, the reference potential may fluctuate slightly.

A capacitance value C(V) of the capacitance element 11 has the following voltage characteristic. As the voltage V increases, the capacitance value C(V) of the capacitance element 11 increases. As indicated by a curve 11a of FIG. 1, the capacitance value C(V) in the protective circuit 10 according to the first embodiment increases more rapidly with an increase in the voltage V. A pn junction diode, a MOS diode, a Schottky diode, or the like is used as the capacitance element 11. A capacitance value C(V) of a pn junction diode is given by $$C(V) = \frac{Cj}{\sqrt{1-V}} \quad (1)$$

where Cj is a junction capacitance value of a pn junction included in the pn junction diode.

On the other hand, the capacitance element 12 has a fixed capacitance value Cc. The capacitance value Cc is greater than the capacitance value C(V) until the voltage V reaches a voltage V1. Furthermore, the capacitance element 12 has a breakdown voltage characteristic (resistance to voltage) higher than that of the circuit element 20. A ceramic capacitance element or the like is used as the capacitance element 12.

A combined capacitance value Cz of the capacitance element 11 and the capacitance element 12 is given by $$Cz = \frac{C(V) \cdot Cc}{C(V) + Cc} \quad (2)$$

As indicated by a curve 13a of FIG. 1, the combined capacitance value Cz has the following voltage characteristic. As the voltage V decreases, the combined capacitance value Cz converges to the capacitance value C(V). As the voltage V increases, the combined capacitance value Cz converges to the capacitance value Cc indicated by a straight line 12a. In other words, the minimum value of the combined capacitance value Cz matches the minimum value of the capacitance value C(V) and the maximum value of the combined capacitance value Cz matches the capacitance value Cc.

A threshold voltage Vth in FIG. 1 indicates a voltage value at which a tangent 14b at an inflection point 14a where the voltage characteristic of the curve 13a indicative of the combined capacitance value Cz changes to the characteristic of converging to the capacitance value Cc crosses a horizontal axis.

The combined capacitance value Cz is sufficiently smaller than the capacitance value Cc before the voltage V exceeds the threshold voltage Vth. After the voltage V exceeds the threshold voltage Vth, the combined capacitance value Cz approximately matches the capacitance value Cc with an increase in the capacitance value C(V).

For example, the capacitance value Cc and the characteristics (such as a junction capacitance value Cj) of the capacitance element 11 are determined so that the threshold voltage Vth will correspond to an upper limit value of the voltage V allowed in the circuit element 20. Description will now be given on the assumption that the threshold voltage Vth matches an upper limit value of the voltage V allowed in the circuit element 20. However, the threshold voltage Vth does not always match an upper limit value of the voltage V allowed in the circuit element 20. For example, a voltage value at the inflection point 14a may be an upper limit value of the voltage V allowed in the circuit element 20.

If the voltage V is lower than the threshold voltage Vth in the above protective circuit 10, the combined capacitance value Cz is sufficiently smaller than the capacitance value Cc and is approximately the capacitance value C(V). That is to say, the capacitance element 11 is dominant and most of the voltage V is applied to the capacitance element 11. A voltage corresponding to the voltage V is applied to the circuit element 20 and the circuit element 20 operates.

On the other hand, if the voltage V is higher than the threshold voltage Vth, the combined capacitance value Cz increases and approaches to the capacitance value Cc. At this time charging the capacitance element 12 is not easily completed and electric charges continue to flow to the capacitance element 12. As a result, the voltage V applied to the circuit element 20 does not increase and the circuit element 20 is protected against an overvoltage.

Furthermore, a resistance component of the capacitance element 12 into which electric charges flow at the time of applying an overvoltage is sufficiently small (almost negligible) compared with a Zener diode or the like. This suppresses power loss. In addition, a fall in voltage caused due to the resistance component is also negligible. This suppresses a rise in the voltage V applied to the circuit element 20.

If only the capacitance element 11, which is a pn junction diode or the like, is used, there is an upper limit to a current which flows. As a result, the upper limit of an applied voltage may be lower than an overvoltage. The protective circuit 10 according to the first embodiment includes the above capacitance element 12. As a result, if the voltage V becomes an overvoltage, the capacitance element 12 becomes dominant. Therefore, most of the voltage V is applied to the capacitance element 12 and the capacitance element 11 is not destroyed.

Furthermore, when the voltage V is lower than an overvoltage (threshold voltage Vth, for example), the use of the capacitance element 11 whose capacitance value C(V) increases more rapidly with an increase in the voltage V makes it possible to make the combined capacitance value Cz sufficiently smaller than the capacitance value Cc. As a result, charging is completed relatively quickly and the voltage V is supplied to the circuit element 20. This suppresses a delay in the beginning of the operation of the circuit element 20.

In the above description the capacitance value C(V) of a pn junction diode is given by expression (1). However, the capacitance value C(V) of a pn junction diode may be given by $$C(V) = Cj \cdot \left(1 - \frac{V}{\phi_0}\right)^{-m} \quad (3)$$

where $\phi_0$ is a zero voltage junction potential (junction potential obtained at the time of not applying a bias voltage) and m is a coefficient.

In addition, a MOS diode may also be used as the capacitance element 11. In that case, the capacitance value C(V) is given by $$C(V) = C_0 \cdot \frac{1}{\sqrt{2(e^{-ub} + e^{ub})}}$$

$$\left[\frac{e^{-ub} \cdot (1 - e^{-V-vs}) + e^{ub} \cdot (e^{V+vs} - 1)}{\{e^{-ub} \cdot (e^{-V-vs} + V + vs - 1) + e^{ub} \cdot (e^{V+vs} - V - vs - 1)\}^{1/2}}\right] \quad (4)$$

$$\text{Where } C_0 = S \cdot \sqrt{\frac{\varepsilon_s \cdot \varepsilon_0 \cdot e^2(n_b + p_b)}{k_B T}}$$

In the above expression (4), ub is a reference potential of a bulk semiconductor (substrate portion of a MOS diode), vs is a surface potential, S is the element area of the MOS diode, $\varepsilon_s$ is the dielectric constant of the bulk semiconductor, $\varepsilon_0$ is the dielectric constant of a vacuum, $n_b$ is the number of n-type carriers in the bulk semiconductor, $p_b$ is the number of p-type carriers in the bulk semiconductor, $k_B$ is a Boltzmann's constant, and T is an absolute temperature. If the bulk semiconductor is of an n type, $n_b$ is approximated by $N_D$ (doping concentration of n-type impurities). Because $N_D \gg p_b$, $p_b$ is negligible.

In addition, the capacitance value C(V) of a MOS diode using an n-type substrate is also given by $$C(V) = W \cdot \left[\frac{q \cdot \varepsilon_s \cdot N_D}{2} \cdot \frac{1 - e^{-(V-V_{TH})/k_B T}}{V - V_{TH} - \frac{n \cdot k_B \cdot T}{q}\{1 - e^{-(V-V_{TH})k_B T}\}}\right]^{1/2} \quad (5)$$

where W is the element width of a MOS diode, q is an elementary charge, $V_{TH}$ is an electric charge generation starting voltage, and n is a coefficient.

Furthermore, if a very strong inversion layer is formed in a MOS diode, the capacitance value C(V) is given by $$C(V) = C_B \cdot W \cdot e^{q\left(V - V_{TH} - \frac{n \cdot k_B \cdot T}{q}\right)} \quad (6)$$

where $C_B$ is a zero voltage constant capacitance.

In FIG. 1, the capacitance element 11 and the capacitance element 12 may be replaced with the capacitance element 12 and the capacitance element 11 respectively. That is to say, one end of the capacitance element 12 is connected to the terminal 20a and the other end of the capacitance element 12 is connected to one end of the capacitance element 11. Furthermore, the other end of the capacitance element 11 is connected to the GND terminal 10a. This is the same with the other embodiments described below.

In addition, the above protective circuit 10 may be connected not to the gate side but to the drain side. For example, the circuit including the capacitance element 11 and the capacitance element 12 connected in series may be connected between the drain terminal of the FET 21 and the GND terminal 10a. Furthermore, the protective circuit 10 may be placed on both of the gate side and the drain side. This is the same with the other embodiments described below.

(Second Embodiment)

Figure 2:
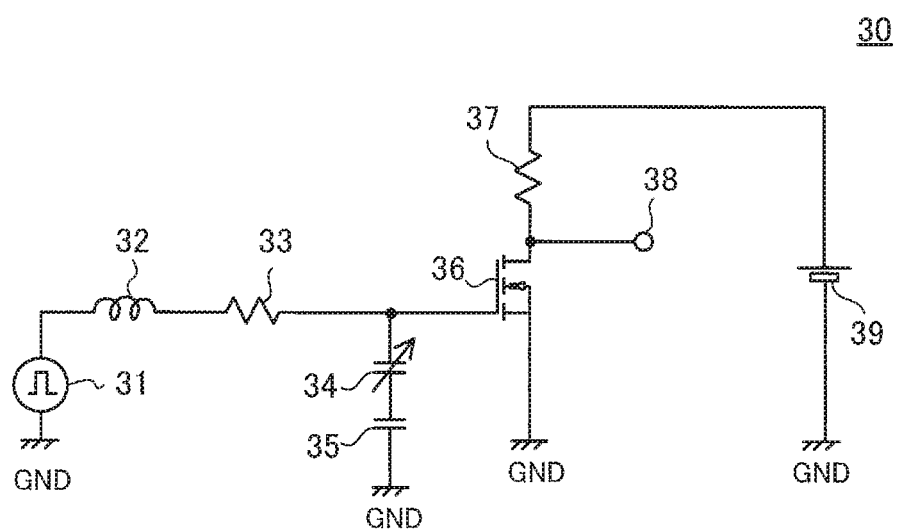
FIG. 2 illustrates an example of a verification circuit for verifying switching operation including a protective circuit which protects a switching element against an overvoltage.

FIG. 2 illustrates an example of a verification circuit for verifying switching operation including a protective circuit which protects a switching element against an overvoltage.

A verification circuit 30 includes an input signal source 31, a wiring inductor 32, a gate resistor 33, a nonlinear capacitance element 34, a fixed capacitance element 35, an n-channel FET 36, a load resistor 37, an output terminal 38, and a DC source 39. The nonlinear capacitance element 34 corresponds to the capacitance element 11 included in the protective circuit 10 according to the first embodiment. The fixed capacitance element 35 corresponds to the capacitance element 12 included in the protective circuit 10 according to the first embodiment.

The input signal source 31 is connected to a gate terminal of the FET 36 via the wiring inductor 32 and the gate resistor 33. Furthermore, the nonlinear capacitance element 34 and the fixed capacitance element 35 are connected in series between the gate terminal of the FET and a GND terminal which is a reference potential terminal. The output terminal 38 and one end of the load resistor 37 are connected to a drain terminal of the FET 36. The DC source 39 is connected to the other end of the load resistor 37. A source terminal of the FET 36 is connected to the GND terminal.

An example of a simulation result for the above verification circuit 30 will be indicated below.

For example, the following conditions are used as simulation conditions.

The input signal source 31 outputs an input voltage having a rectangular voltage waveform. The input voltage has a cycle of 1 microsecond and a duty ratio of 50 percent and changes in the range of 0 to 10 V. An inductance value of the wiring inductor 32 is 30 nH. A resistance value of the gate resistor 33 is 1Ω. A resistance value of the load resistor 37 is 25Ω. The DC source 39 outputs a DC voltage of 400 V.

In order to control the threshold voltage Vth illustrated in FIG. 1, a plurality of pn junction diodes connected in series, for example, are used as the nonlinear capacitance element 34. Hereinafter it is assumed that control is exercised so as to set the threshold voltage Vth to about 5 V. In addition, the dependence of a capacitance value of one pn junction diode on a voltage is given by expression (1). It is assumed that a junction capacitance value Cj is about 100 pF.

For example, a ceramic capacitance element having, for example, a breakdown voltage of 1 kV and a capacitance value of 1 μF is used as the fixed capacitance element 35. As long as these breakdown voltage and capacitance value are realized, a capacitance element other than a ceramic capacitance element may be used.

The FET 36 is, for example, a GaN transistor.

A drain current $I_{DS}$ of the FET 36 is represented by the use of $$I_{DS} = K_p \cdot \frac{W}{L - 2 \cdot LD} \cdot \left(V_{GS} - V_{TH} - \frac{V_{DS}}{2}\right) \cdot V_{DS} \cdot (1 + \lambda \cdot V_{DS}) \quad (7)$$

LINEAR AREA $$I_{DS} = \frac{K_p}{2} \cdot \frac{W}{L - 2 \cdot LD} \cdot (V_{GS} - V_{TH})^2 \cdot (1 + \lambda \cdot V_{DS})$$

SATURATION AREA where $V_{TH} = V_{T0} + \gamma \cdot \left(\sqrt{2\phi_p - V_{BS}} - \sqrt{2\phi_p}\right)$.

In the above expressions (7), $K_p$ is a mutual conductance parameter and is 4000 A/V², W is a channel width scaling factor and is 1.0, L is a channel length scaling factor and is 1.0, LD is the length of an extended region of a drain region or a source region and is 0.0, $V_{GS}$ is a gate-source voltage, $V_{DS}$ is a drain-source voltage, λ is a channel length modulation parameter and is 0.0, $V_{T0}$ is a threshold voltage and is 2.1 V, γ is a coefficient which provides a body effect and is 0V$^{1/2}$, $\phi_p$ is a surface inversion potential and is 0.6 V, and $V_{BS}$ is a substrate bias voltage.

A gate-source capacitance $C_{GS}$ and a gate-drain capacitance $C_{GD}$ are represented according to a usage area (magnitude of $V_{GS}$) by:

USAGE AREA $V_{GS} < V_{on} - 2\phi_p$ (8)

$$C_{GS} = C_{GS0} \cdot W$$

$$C_{GD} = C_{GD0} \cdot W$$

USAGE AREA $V_{GS} > V_{on} + V_{DS}$ $$C_{GS} = C_{OX} \cdot W \cdot \left\{1 - \left[\frac{V_{GS} - V_{DS} - V_{on}}{2(V_{GS} - V_{on}) - V_{DS}}\right]^2\right\} + C_{GS0} \cdot W$$

$$C_{GD} = C_{OX} \cdot W \cdot \left\{1 - \left[\frac{V_{GS} - V_{on}}{2(V_{GS} - V_{on}) - V_{DS}}\right]^2\right\} + C_{GD0} \cdot W$$

USAGE AREA $V_{on} - 2\phi_p < V_{GS} < V_{on}$ $$C_{GS} = \frac{2}{3} C_{OX} \cdot W \cdot \left(\frac{V_{on} - V_{GS}}{2\phi_p} + 1\right) + C_{GS0} \cdot W$$

$$C_{GD} = C_{GD0} \cdot W$$

UASGE AREA $V_{on} < V_{GS} < V_{on} + V_{DS}$ $$C_{GS} = \frac{2}{3} C_{OX} \cdot W + C_{GS0} \cdot W$$

$$C_{GD} = C_{GD0} \cdot W$$

where $V_{on}$ is an on-state voltage of the FET 36, $C_{GS0}$ is a zero bias gate-source capacitance and is 0.0 F, $C_{GD0}$ is a zero bias gate-drain capacitance and is 0.0 F, and $C_{OX}$ is a capacitance value per unit area of an oxide film and is 3 nF.

In addition, there are various parameters indicative of the FET 36. However, descriptions of them will be omitted.

Figure 3:
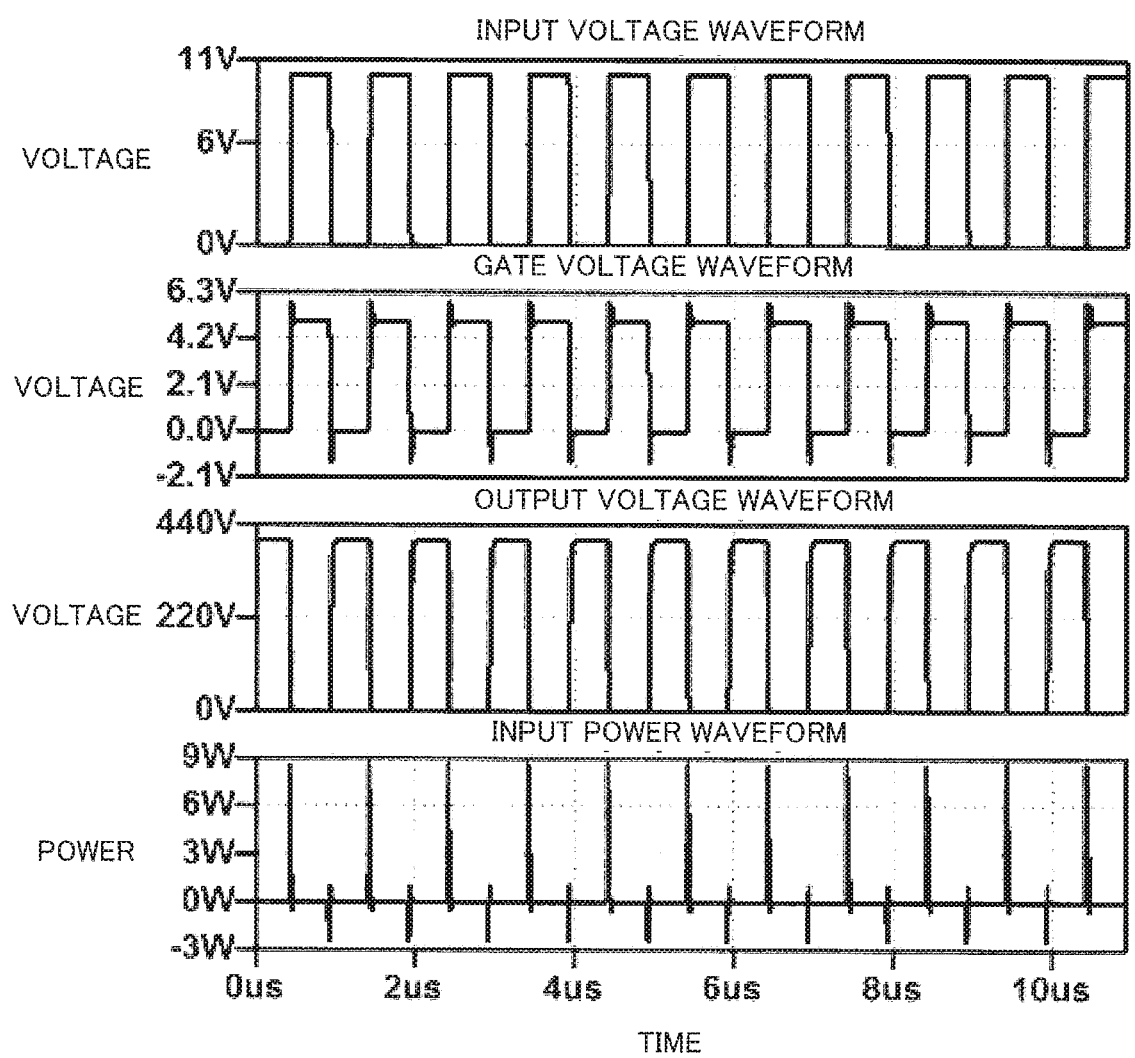
FIG. 3 illustrates an example of a simulation result.

FIG. 3 illustrates an example of a simulation result. FIG. 3 illustrates an example of a simulation result obtained by performing a simulation under the above conditions.

FIG. 3 indicates from the top an input voltage waveform generated by the input signal source 31, a gate voltage waveform at the gate terminal of the FET 36, an output voltage waveform at the output terminal 38, and an input power waveform. In FIG. 3, a horizontal axis indicates time. In FIG. 3, a vertical axis indicates a voltage on graphs indicative of the input voltage waveform, the gate voltage waveform, and the output voltage waveform and indicates power on a graph indicative of the input power waveform.

As indicated in FIG. 3, the gate voltage waveform settles down to a constant value after it rises. The constant value is about 5 V and is about 5 V lower than the maximum value of the input voltage waveform which is 10 V. Furthermore, the output voltage waveform makes a transition between about 400 V and 0 V. This indicates that the FET 36 correctly performs switching operation. The input power waveform indicates power consumed by the elements included between the input signal source 31 and the gate terminal of the FET 36. The average value of the input power waveform from 0 to 11 μsec is 0.19 W.

(Comparative Example)

Figure 4:
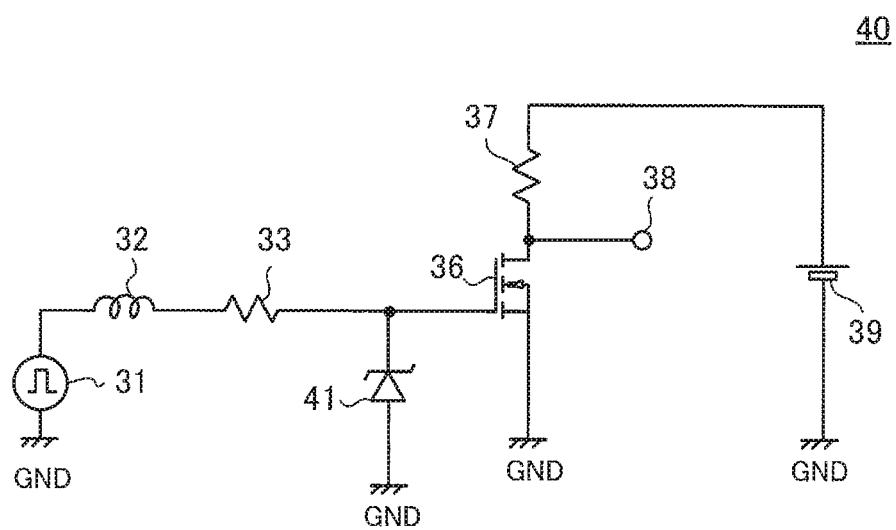
FIG. 4 illustrates an example in which a Zener diode is used as a protective circuit.

FIG. 4 illustrates an example in which a Zener diode is used as a protective circuit. Components in FIG. 4 which are the same as those illustrated in FIG. 2 are marked with the same numerals.

A verification circuit 40 illustrated in FIG. 4 includes a Zener diode 41 connected between a gate terminal of an FET 36 and a GND terminal in place of the nonlinear capacitance element 34 and the fixed capacitance element 35 illustrated in FIG. 2. An anode of the Zener diode 41 is connected to the GND terminal and a cathode of the Zener diode 41 is connected to the gate terminal of an FET 36.

An example of a simulation result for the above verification circuit 40 will be described below.

It is assumed that a Zener voltage of the Zener diode 41 is 4.7 V. The other simulation conditions are the same with the verification circuit 30.

Figure 5:
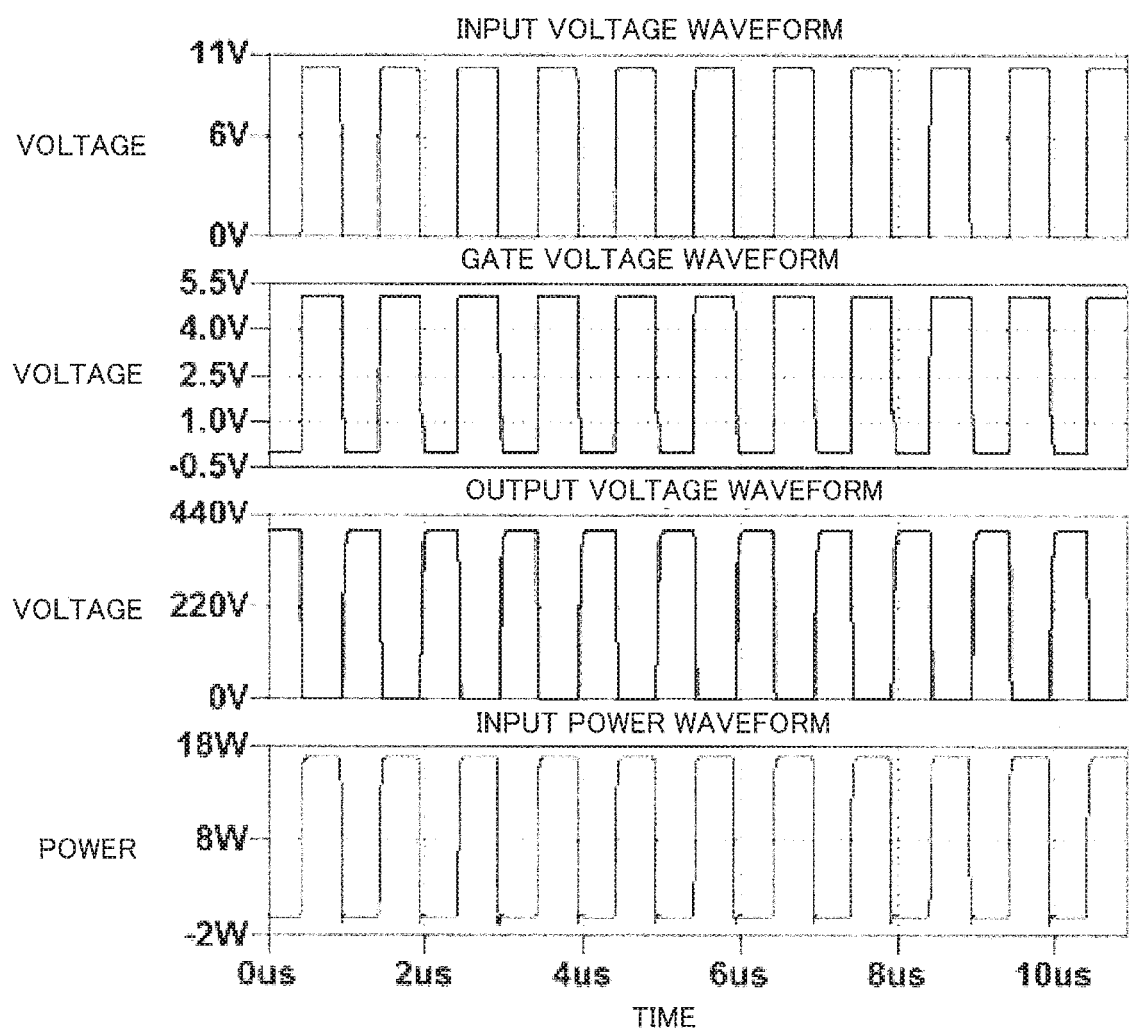
FIG. 5 illustrates an example of a simulation result for a verification circuit using a Zener diode.

FIG. 5 illustrates an example of a simulation result for the verification circuit using the Zener diode.

FIG. 5 indicates from the top an input voltage waveform generated by an input signal source 31, a gate voltage waveform at the gate terminal of the FET 36, an output voltage waveform at an output terminal 38, and an input power waveform. In FIG. 5, a horizontal axis indicates time. In FIG. 5, a vertical axis indicates a voltage on graphs indicative of the input voltage waveform, the gate voltage waveform, and the output voltage waveform and indicates power on a graph indicative of the input power waveform.

As indicated in FIG. 5, the maximum value of the gate voltage waveform is about 5 V and is about 5 V lower than the maximum value of the input voltage waveform which is 10 V. However, the average value of the input power waveform from 0 to 11 μsec is 8.39 W.

As can be seen from the above simulation results, the use of the nonlinear capacitance element 34 and the fixed capacitance element 35 connected in series as a protective circuit makes power consumption (power loss) about 1/44 times the power consumption (power loss) of the verification circuit 40 using the Zener diode in the above way as a protective circuit.

An example in which a protective circuit including the above nonlinear capacitance element and fixed capacitance element connected in series is applied to a switching power supply apparatus will now be described.

(Third Embodiment)

Figure 6:
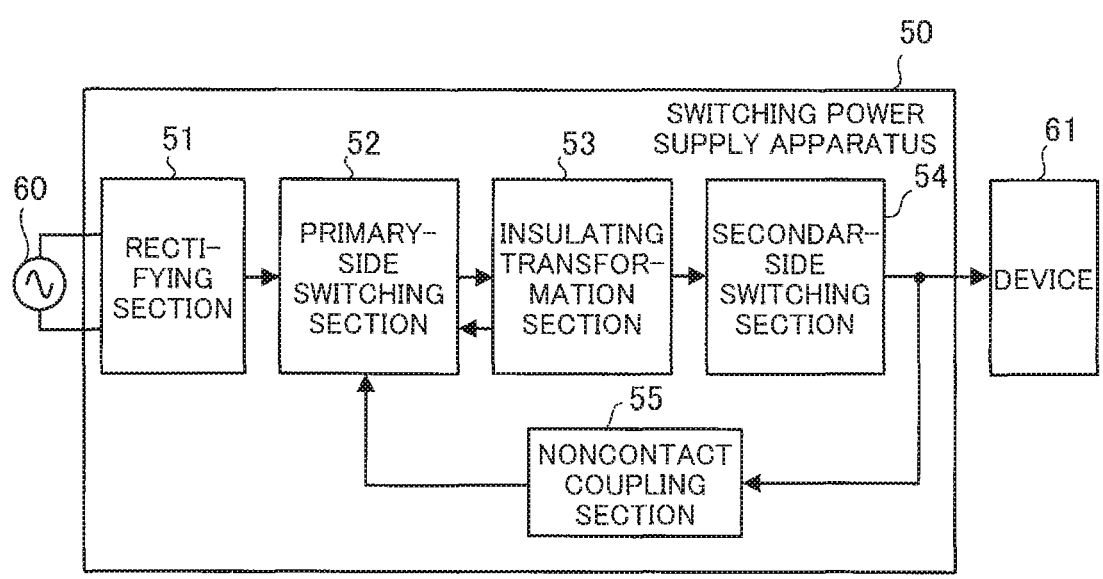
FIG. 6 illustrates an example of a switching power supply apparatus according to a third embodiment.

FIG. 6 illustrates an example of a switching power supply apparatus according to a third embodiment.

A switching power supply apparatus 50 converts an AC voltage supplied from an AC source 60 to a DC voltage, and supplies it to a device 61. The switching power supply apparatus 50 includes a rectifying section 51, a primary-side switching section 52, an insulating transformation section 53, a secondary-side switching section 54, and a noncontact coupling section 55.

The rectifying section 51 rectifies an AC voltage and outputs a rectified signal.

The primary-side switching section 52 converts the rectified signal to a pulse-wave AC signal by switching operation. Furthermore, the primary-side switching section 52 receives via the noncontact coupling section 55 a DC voltage generated by the secondary-side switching section 54. On the basis of the DC voltage, the primary-side switching section 52 exercises control to set the ratio (duty ratio) of switch-on time to the cycle of an AC signal waveform (switching waveform) to a proper value.

The insulating transformation section 53 transforms the pulse-wave AC signal.

The secondary-side switching section 54 performs synchronous rectification of a transformed AC signal to generate a DC current and a DC voltage, and supplies them to the device 61.

The noncontact coupling section 55 feeds back the DC voltage to the primary-side switching section 52.

Figure 7:
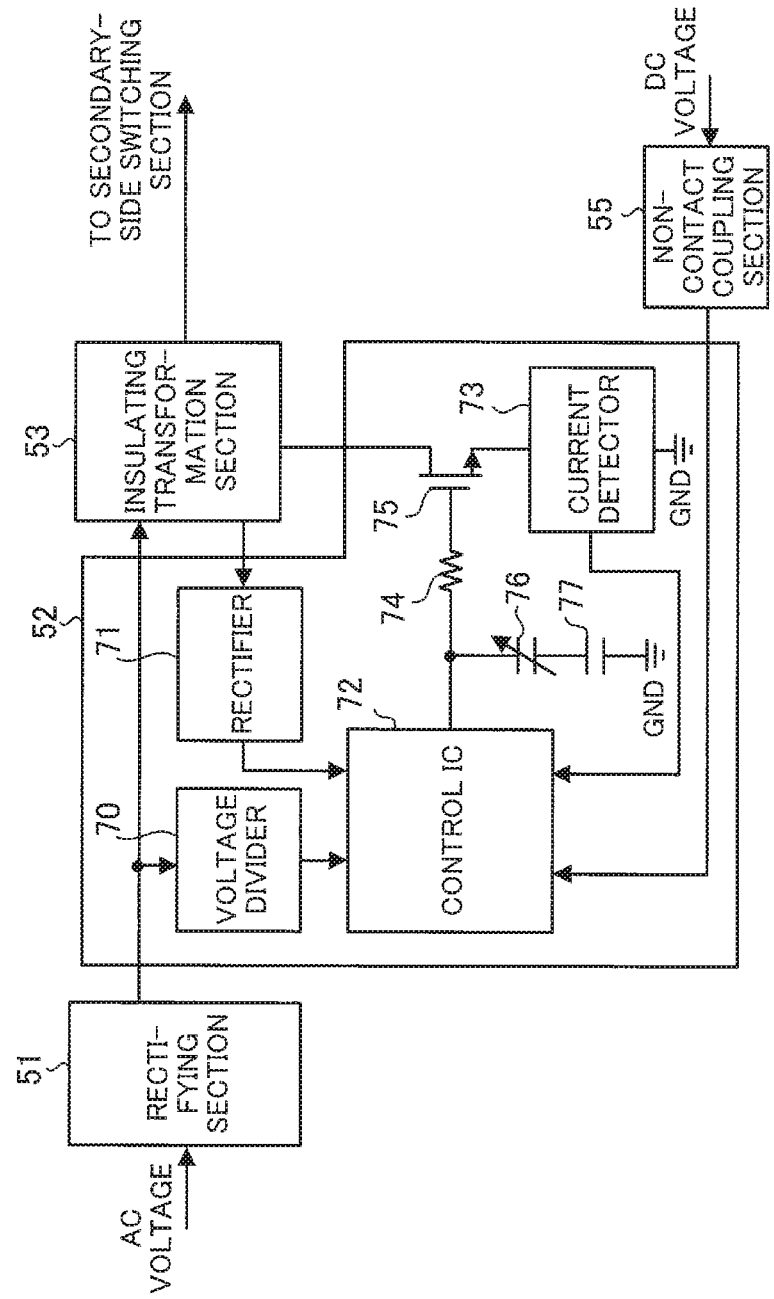
FIG. 7 illustrates an example of a primary-side switching section.

FIG. 7 illustrates an example of the primary-side switching section.

The primary-side switching section 52 includes a voltage divider 70, a rectifier 71, a control integrated circuit (IC) 72, a current detector 73, a gate resistor 74, an FET 75, a nonlinear capacitance element 76, and a fixed capacitance element 77.

The voltage divider 70 voltage-divides the rectified signal outputted by the rectifying section 51 and generates a source voltage of the control IC 72.

The rectifier 71 rectifies part of the transformed pulse-wave AC signal and generates a source voltage of the control IC 72.

When a source voltage reaches an operable voltage, the control IC 72 outputs a control signal (gate voltage) by which on-off timing of the FET 75, which is a switching element, is controlled. For example, the control IC 72 outputs a rectangular-wave control signal for gate drive which is used for an Si-MOSFET and which changes in the range of 0 to 10 V.

Furthermore, the control IC 72 receives via the noncontact coupling section 55 the DC voltage generated by the secondary-side switching section 54. On the basis of the DC voltage, the primary-side switching section 52 exercises control to set the ratio of on-time of the FET 75 to the cycle of a switching waveform to a proper value. In addition, if a value of a current detected by the current detector 73 is abnormal, the control IC 72 stops, for example, switching operation.

The current detector 73 detects a value of a current flowing through a source terminal of the FET 75 and informs the control IC 72 of the value of the current detected.

The gate resistor 74 is connected to a gate terminal of the FET 75.

The FET 75 outputs a pulse-wave AC signal by switching operation. For example, the FET 75 is a normally-off GaN transistor having a breakdown voltage of 650 V, a maximum recommended gate input voltage of 6 V, and a threshold voltage of about 2 V. A drain terminal of the FET 75 is connected to the insulating transformation section 53 and the source terminal of the FET 75 is connected to the current detector 73. The FET 75 is not limited to a GaN transistor. For example, the FET 75 may be an Si-MOSFET or an FET using gallium arsenide (GaAs).

The nonlinear capacitance element 76 corresponds to the nonlinear capacitance element 34 illustrated in FIG. 2. For example, a circuit including five pn junction diodes connected in parallel and each having a junction capacitance value Cj of 10 to 10000 pF is used as the nonlinear capacitance element 76. A MOS diode or the like may be used as the nonlinear capacitance element 76. One end of the nonlinear capacitance element 76 is connected to an output terminal of the control IC 72 and is connected to the gate terminal of the FET 75 via the gate resistor 74. The other end of the nonlinear capacitance element 76 is connected to one end of the fixed capacitance element 77.

The fixed capacitance element 77 corresponds to the fixed capacitance element 35 illustrated in FIG. 2. For example, the fixed capacitance element 77 is a ceramic capacitance element having a breakdown voltage of about 250 V and a capacitance value of about 1 μF. The other end of the fixed capacitance element 77 is connected to a GND terminal.

It is assumed that a capacitance value of the nonlinear capacitance element 76 and a capacitance value of the fixed capacitance element 77 are C(V) and Cc respectively. At this time the number of pn junction diodes connected in parallel, the junction capacitance value Cj, and the capacitance value Cc are set so that, for example, the threshold voltage Vth illustrated in FIG. 1 will correspond to the maximum recommended gate input voltage (corresponding to the breakdown voltage of a gate portion) of the FET 75.

With the above primary-side switching section 52 a voltage of a control signal outputted by the control IC 72 may be higher than the maximum recommended gate input voltage of the FET 75. However, the nonlinear capacitance element 76 and the fixed capacitance element 77 are included. As a result, if a voltage of a control signal exceeds the threshold voltage Vth, electric charges continue to flow to the fixed capacitance element 77. Therefore, a gate voltage of the FET 75 is controlled so as not to become an overvoltage. Furthermore, because a resistance component of the fixed capacitance element 77 is small, power loss is suppressed.

In addition, a control IC used for an Si-MOSFET for power control may be used as the control IC 72. Accordingly, there is no need to newly develop a control IC for an FET the breakdown voltage of whose gate portion is lower than that of a gate portion of an Si-MOSFET for power control.

(Fourth Embodiment)

Figure 8:
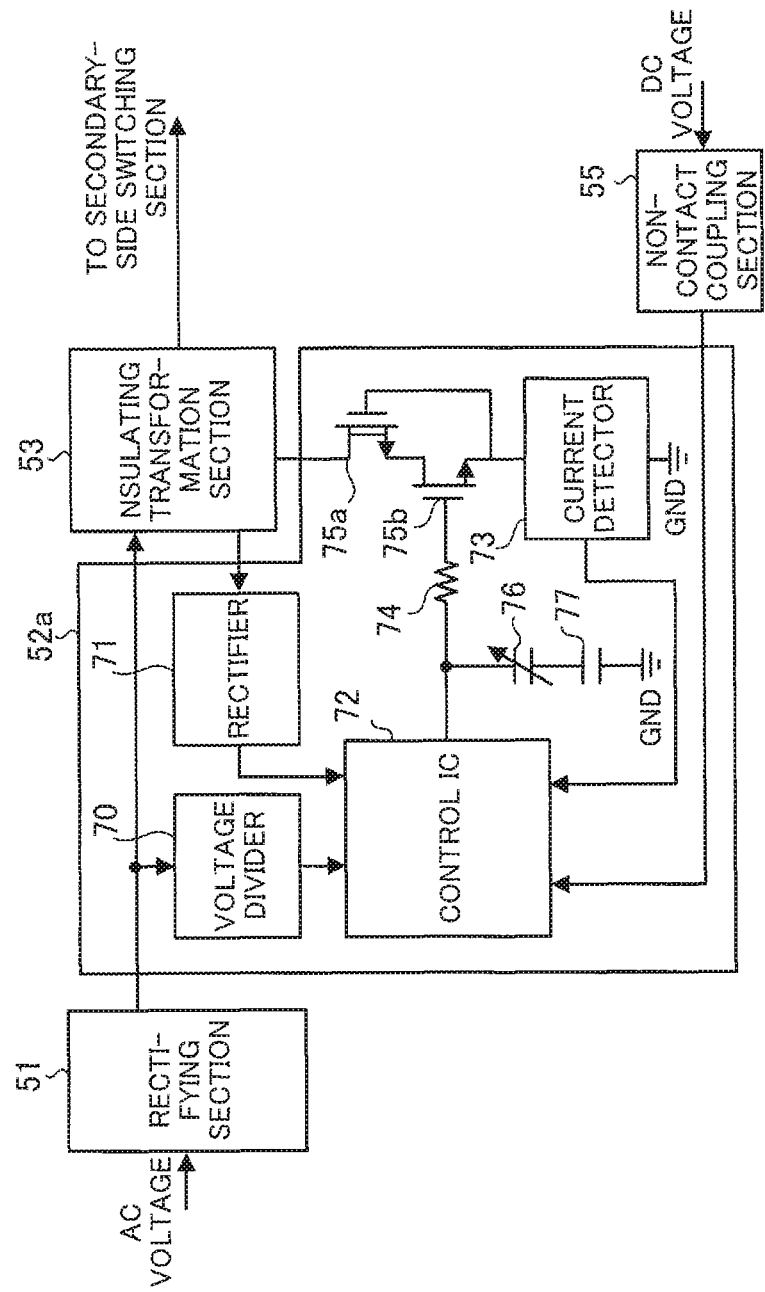
FIG. 8 illustrates an example of a primary-side switching section of a switching power supply apparatus according to a fourth embodiment.

FIG. 8 illustrates an example of a primary-side switching section of a switching power supply apparatus according to a fourth embodiment. Components in FIG. 8 which are the same as those of the primary-side switching section 52 illustrated in FIG. 7 are marked with the same numerals.

A primary-side switching section 52*a* includes two FETs 75*a* and 75*b* cascode-connected in place of the FET 75 of the primary-side switching section 52 illustrated in FIG. 7.

For example, a normally-on GaN transistor having a threshold voltage of about −10 V, a breakdown voltage of about 650 V, and an on-state resistance of about 150 to 250 mΩ is used as the FET 75*a*. A drain of the FET 75*a* is connected to an insulating transformation section 53 and a source of the FET 75*a* is connected to a drain of the FET 75*b*. A gate of the FET 75*a* is connected to a source of the FET 75*b* and a current detector 73.

In order to realize normally-off, the FET 75*b* is cascode-connected to the FET 75*a*. For example, in order to put the high speed of the FET 75*a*, which is a GaN transistor, to practical use, a short-gate-length Si-MOS transistor whose gate length is made shorter than a gate length of an ordinary transistor having a breakdown voltage of 650 V to reduce input capacitance is used as the FET 75*b*. For example, a short-gate-length Si-MOS transistor having a breakdown voltage of about 100 V and an on-state resistance of about several milliohms is used.

In the primary-side switching section 52*a*, a control signal outputted by a control IC 72 is supplied to a gate terminal of the short-gate-length FET 75*b*. For example, if a rectangular-wave control signal which is outputted by the control IC 72 and which changes in the range of 0 to 10 V is supplied in its original condition to the gate terminal of the short-gate-length FET 75*b*, a gate portion may be destroyed. With the primary-side switching section 52*a* illustrated in FIG. 8, however, electric charges continue to flow to a fixed capacitance element 77 if a voltage of a control signal exceeds the threshold voltage Vth. As a result, a gate voltage of the FET 75*b* is controlled so as not to become an overvoltage. This prevents the gate portion from being destroyed. Furthermore, because a resistance component of the fixed capacitance element 77 is small, power loss is suppressed.

(Fifth Embodiment)

Figure 9:
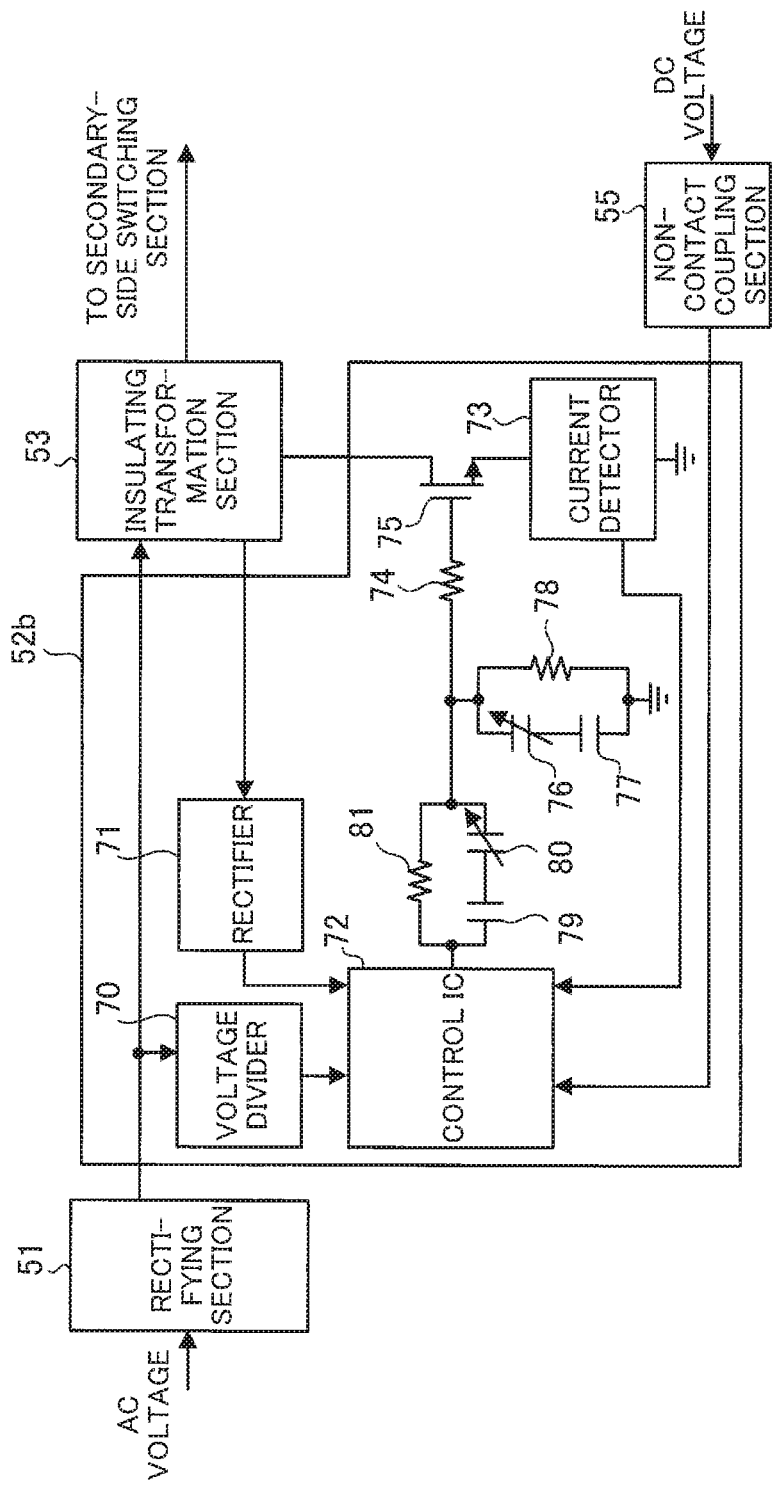
FIG. 9 illustrates an example of a primary-side switching section of a switching power supply apparatus according to a fifth embodiment.

FIG. 9 illustrates an example of a primary-side switching section of a switching power supply apparatus according to a fifth embodiment. Components in FIG. 9 which are the same as those of the primary-side switching section 52 illustrated in FIG. 7 are marked with the same numerals.

A primary-side switching section 52*b* includes a resistance element 78 connected in parallel with a circuit including a nonlinear capacitance element 76 and a fixed capacitance element 77 connected in series. Furthermore, a circuit including a fixed capacitance element 79 and a nonlinear capacitance element 80 connected in series is connected to an output terminal of a control IC 72. A resistance element 81 is connected in parallel with the circuit including the fixed capacitance element 79 and the nonlinear capacitance element 80 connected in series.

The resistance element 78 has a resistance value of, for example, 1 to 100 kΩ.

The fixed capacitance element 79 has a capacitance value of, for example, about 10 to 10000 pF.

The nonlinear capacitance element 80 is a pn junction diode, a Schottky diode, or the like having, for example, an on-state voltage of 0.7 to 1.0 V, a reverse breakdown voltage of 10 V or more, and a junction capacitance value Cj of about 10 to 10000 pF.

The resistance element 81 has a resistance value of, for example, 1 to 100 kΩ.

As stated above, the primary-side switching section 52*b* includes a parallel circuit including the series circuit made up of the nonlinear capacitance element 76 and the fixed capacitance element 77 connected in series and the resistance element 78 connected in parallel with the series circuit. Furthermore, the primary-side switching section 52*b* includes a parallel circuit including the series circuit made up of the nonlinear capacitance element 80 and the fixed capacitance element 79 connected in series and the resistance element 81 connected in parallel with the series circuit. In addition, these two parallel circuits are connected in series.

The adoption of the above structure makes it possible to change a time constant of a transient response of a gate voltage of an FET 75 by changing a resistance value of the resistance element 78, a resistance value of the resistance element 81, a capacitance value of the fixed capacitance element 79, and a junction capacitance value Cj of the nonlinear capacitance element 80.

For example, it is assumed that a transistor having a low threshold voltage (normally-off GaN transistor having a threshold voltage of about 2 V, for example) is used as the FET 75. Although control is exercised so as to put the FET 75 in an off state, the FET 75 may be in an on state by the influence of noise or the like. Accordingly, by changing the above time constant, control is exercised so that a gate voltage of the FET 75 will be undershot to 0 V or less at the time of turning off the FET 75. As a result, the FET 75 is reliably turned off.

Figure 10:
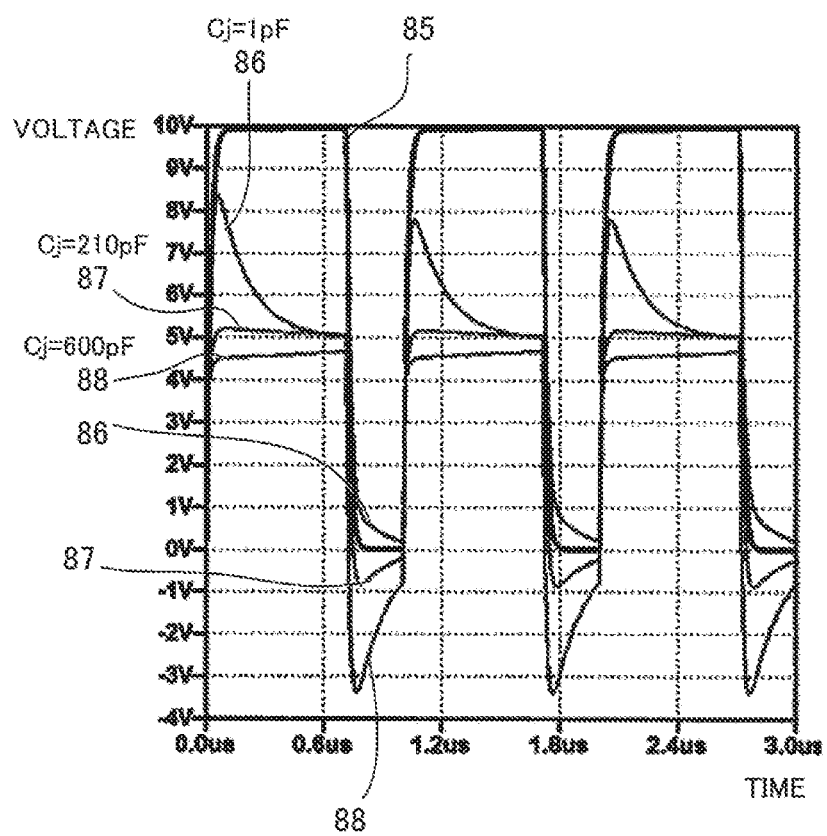
FIG. 10 illustrates an example of a simulation result of a control signal outputted by a control IC and a gate voltage waveform of an FET.

FIG. 10 illustrates an example of a simulation result of a control signal outputted by the control IC and a gate voltage waveform of the FET. In FIG. 10, a horizontal axis indicates time and a vertical axis indicates voltage.

FIG. 10 illustrates an example of a rectangular-wave control signal 85 which is outputted by the control IC 72 and which changes in the range of 0 to 10 V and gate voltage waveforms 86, 87, and 88 obtained at the time of setting a junction capacitance value Cj of the nonlinear capacitance element 80 to 1 pF, 210 pF, and 600 pF respectively.

As illustrated in FIG. 10, a change in the junction capacitance value Cj of the nonlinear capacitance element 80 causes a change in the magnitude of an undershoot or an overshoot. In the example of FIG. 10, the gate voltage waveform 88 obtained at the time of setting a junction capacitance value Cj of the nonlinear capacitance element 80 to 600 pF indicates the largest undershoot.

With the above primary-side switching section 52*b* the same effect that is obtained by the primary-side switching section 52 in the third embodiment is obtained. In addition, a time constant of a transient response of a gate voltage of the FET 75 is controlled. Therefore, the undershoots indicated in FIG. 10 are realized. Even if the FET 75 having a low threshold voltage is used, the occurrence of a malfunction caused by external noise is suppressed.

(Sixth Embodiment)

Figure 11:
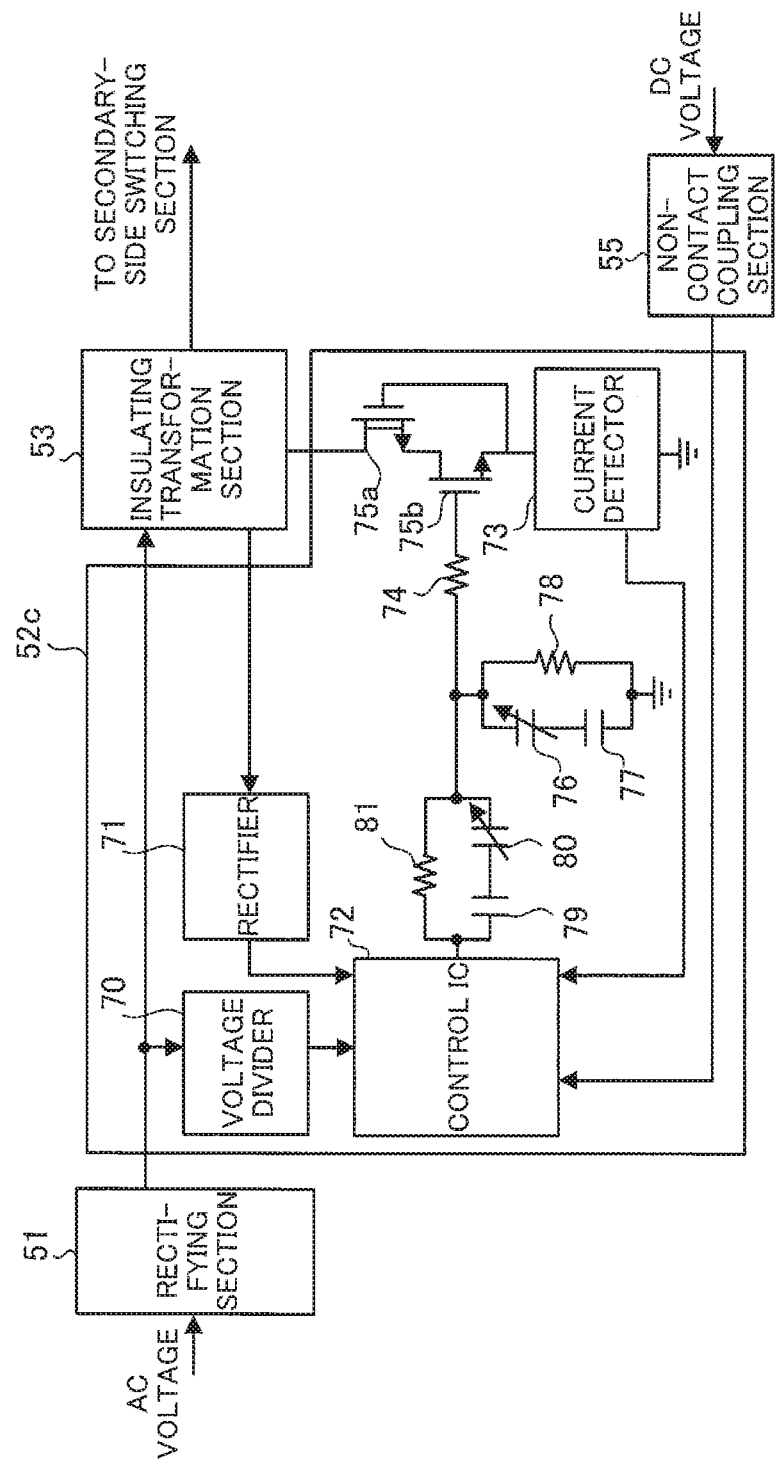
FIG. 11 illustrates an example of a primary-side switching section of a switching power supply apparatus according to a sixth embodiment.

FIG. 11 illustrates an example of a primary-side switching section of a switching power supply apparatus according to a sixth embodiment. Components in FIG. 11 which are the same as those of the primary-side switching sections 52a and 52b illustrated in FIGS. 8 and 9, respectively, are marked with the same numerals.

A primary-side switching section 52c is realized by combining the primary-side switching sections 52a and 52b illustrated in FIGS. 8 and 9 respectively.

If a short-gate-length FET, for example, is used, as stated above, as an FET 75b, the FET 75b has a low threshold voltage due to a short channel effect. As a result, the FET 75b is easily turned on by external noise. This is the same with a normally-off GaN transistor having a low threshold voltage.

Therefore, a transient response of a gate voltage of the FET 75b is controlled by the use of a nonlinear capacitance element 80, a fixed capacitance element 79, and a resistance element 81 to produce an undershoot like those indicated in FIG. 10. This suppresses the occurrence of a malfunction of the FET 75b caused by external noise.

(Seventh Embodiment)

By the way, the above circuit for protecting against an overvoltage including the nonlinear capacitance element and the fixed capacitance element connected in series may also be placed in the secondary-side switching section 54. Furthermore, the above circuit including the nonlinear capacitance element and the fixed capacitance element connected in series may be placed only in the secondary-side switching section 54.

Figure 12:
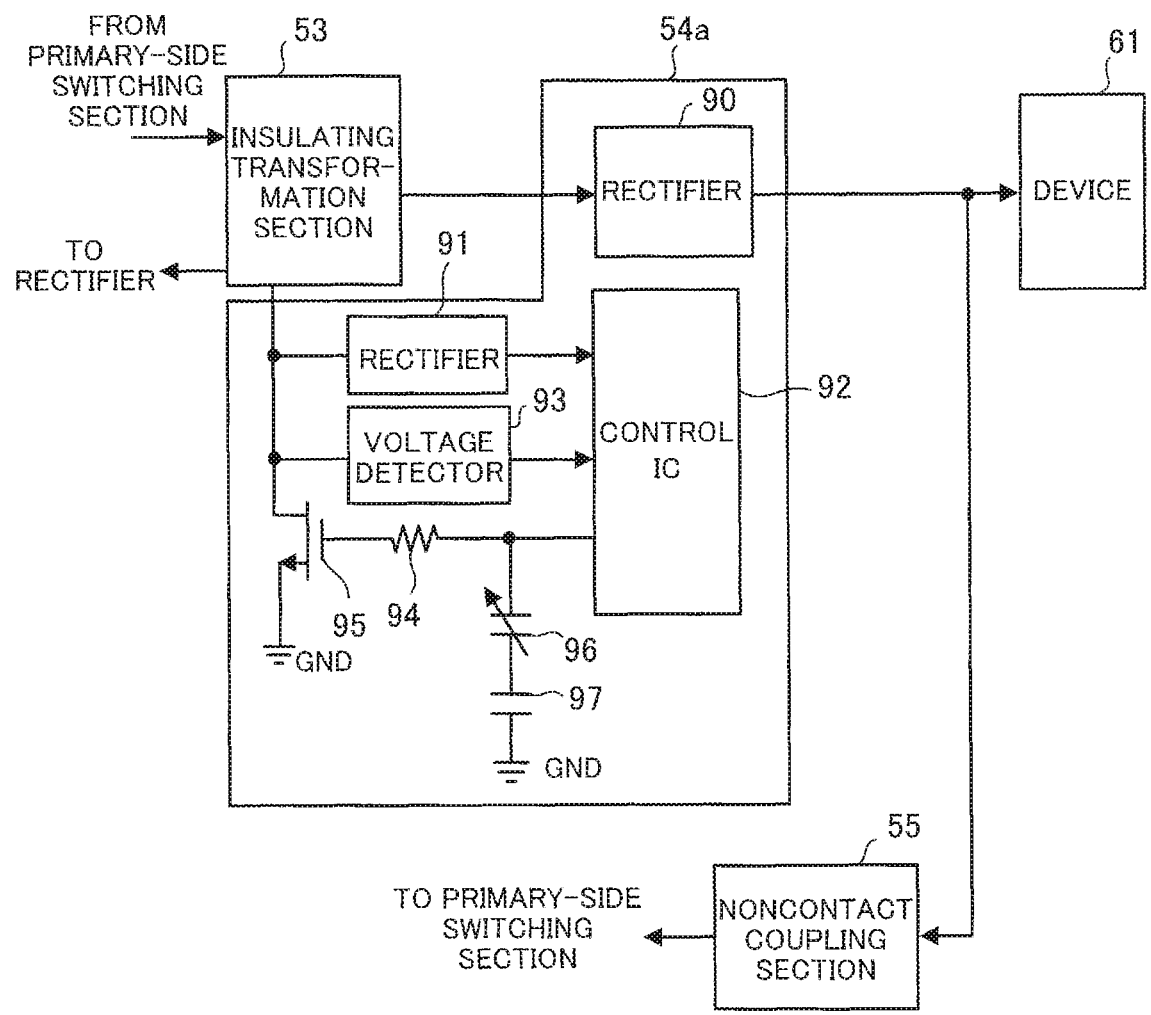
FIG. 12 illustrates an example of a secondary-side switching section of a switching power supply apparatus according to a seventh embodiment.

FIG. 12 illustrates an example of a secondary-side switching section of a switching power supply apparatus according to a seventh embodiment.

A secondary-side switching section 54a performs synchronous commutation. The secondary-side switching section 54a includes rectifiers 90 and 91, a control IC 92, a voltage detector 93, a gate resistor 94, an FET 95, a nonlinear capacitance element 96, and a fixed capacitance element 97.

The rectifier 90 rectifies a transformed AC signal, generates a DC current and a DC voltage, and supplies them to a device 61.

The rectifier 91 rectifies switched current and voltage waveforms to convert them to DC current and voltage waveforms, and supplies them to the control IC 92.

The control IC 92 receives a drain voltage of the FET 95 detected by the voltage detector 93 and outputs, on the basis of the drain voltage, a control signal for turning on or off the FET 95 with proper timing. For example, the control IC 92 outputs a rectangular-wave control signal for gate drive which is used for an Si-MOSFET for power control and which changes in the range of 0 to 10 V.

The voltage detector 93 detects a value of the drain voltage of the FET 95 and informs the control IC 92 of the detected value of the drain voltage.

The gate resistor 94 is connected to a gate terminal of the FET 95.

The FET 95 is, for example, a normally-off GaN transistor having a breakdown voltage of 650 V, a maximum recommended gate input voltage of 6 V, and a threshold voltage of about 2 V. A drain terminal of the FET 95 is connected to an insulating transformation section 53 and a source terminal of the FET 95 is connected to a GND terminal. The FET 95 is not limited to a GaN transistor. For example, the FET 95 may be an Si-MOSFET or an FET using GaAs.

The nonlinear capacitance element 96 corresponds to the nonlinear capacitance element 34 illustrated in FIG. 2. For example, a circuit including five pn junction diodes connected in parallel and each having a junction capacitance value Cj of 10 to 10000 pF is used as the nonlinear capacitance element 96. A MOS diode or the like may be used as the nonlinear capacitance element 96. One end of the nonlinear capacitance element 96 is connected to an output terminal of the control IC 92 and is connected to the gate terminal of the FET 95 via the gate resistor 94. The other end of the nonlinear capacitance element 96 is connected to one end of the fixed capacitance element 97.

The fixed capacitance element 97 corresponds to the fixed capacitance element 35 illustrated in FIG. 2. For example, the fixed capacitance element 97 is a ceramic capacitance element having a breakdown voltage of about 250 V and a capacitance value of about 1 μF. The other end of the fixed capacitance element 97 is connected to the GND terminal.

It is assumed that a capacitance value of the nonlinear capacitance element 96 and a capacitance value of the fixed capacitance element 97 are C(V) and Cc respectively. At this time the number of pn junction diodes connected in parallel, the junction capacitance value Cj, and the capacitance value Cc are set so that, for example, the threshold voltage Vth illustrated in FIG. 1 will become the maximum recommended gate input voltage (corresponding to the breakdown voltage of a gate portion) of the FET 95.

With the above secondary-side switching section 54a a voltage of a control signal outputted by the control IC 92 may be higher than the maximum recommended gate input voltage of the FET 95. However, the nonlinear capacitance element 96 and the fixed capacitance element 97 are included. As a result, if a voltage of a control signal exceeds the threshold voltage Vth, electric charges continue to flow to the fixed capacitance element 97. Therefore, a gate voltage of the FET 95 is controlled so as not to become an overvoltage. Furthermore, because a resistance component of the fixed capacitance element 97 is small, power loss is suppressed.

In addition, a control IC used for an Si-MOSFET for power control may be used as the control IC 92. Accordingly, there is no need to newly develop a control IC for an FET the breakdown voltage of whose gate portion is lower than that of a gate portion of an Si-MOSFET for power control.

(Eighth Embodiment)

Figure 13:
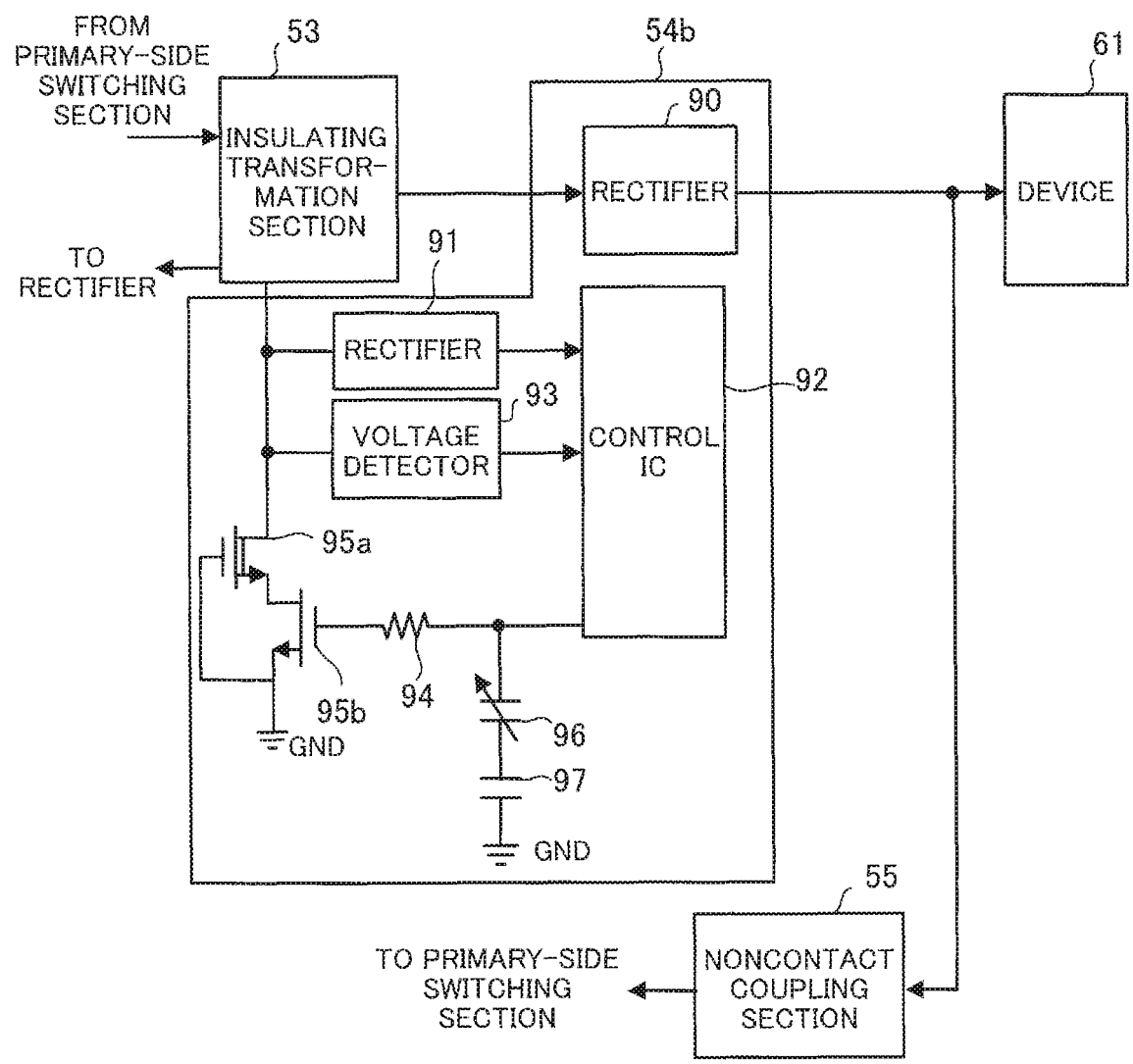
FIG. 13 illustrates an example of a secondary-side switching section of a switching power supply apparatus according to an eighth embodiment.

FIG. 13 illustrates an example of a secondary-side switching section of a switching power supply apparatus according to an eighth embodiment. Components in FIG. 13 which are the same as those of the secondary-side switching section 54a illustrated in FIG. 12 are marked with the same numerals.

A secondary-side switching section 54b includes two FETs 95a and 95b cascode-connected in place of the FET 95 of the secondary-side switching section 54a illustrated in FIG. 12.

For example, a normally-on GaN transistor having a threshold voltage of about −10 V, a breakdown voltage of about 650 v, and an on-state resistance of about 150 to 250 mΩ is used as the FET 95a. A drain of the FET 95a is connected to an insulating transformation section 53 and a source of the FET 95a is connected to a drain of the FET 95b. A gate of the FET 95a is connected to a source of the FET 95b and a GND terminal.

In order to realize normally-off, the FET 95b is cascode-connected to the FET 95a. For example, in order to put the high speed of the FET 95a, which is a GaN transistor, to practical use, a short-gate-length Si-MOS transistor whose gate length is made shorter than a gate length of an ordinary transistor having a breakdown voltage of 650 V to reduce input capacitance is used as the FET 95b. For example, a short-gate-length Si-MOS transistor having a breakdown voltage of about 100 V and an on-state resistance of about several milliohms is used.

In the secondary-side switching section 54b, a control signal outputted by a control IC 92 is supplied to a gate terminal of the short-gate-length FET 95b. For example, if a rectangular-wave control signal which is outputted by the control IC 92 and which changes in the range of 0 to 10 V is supplied in its original condition to the gate terminal of the short-gate-length FET 95b, a gate portion may be destroyed. With the secondary-side switching section 54b illustrated in FIG. 13, however, electric charges continue to flow to a fixed capacitance element 97 if a voltage of a control signal exceeds the threshold voltage Vth. As a result, a gate voltage of the FET 95b is controlled so as not to become an overvoltage. This prevents the gate portion from being destroyed. Furthermore, because a resistance component of the fixed capacitance element 97 is small, power loss is suppressed.

(Ninth Embodiment)

Figure 14:
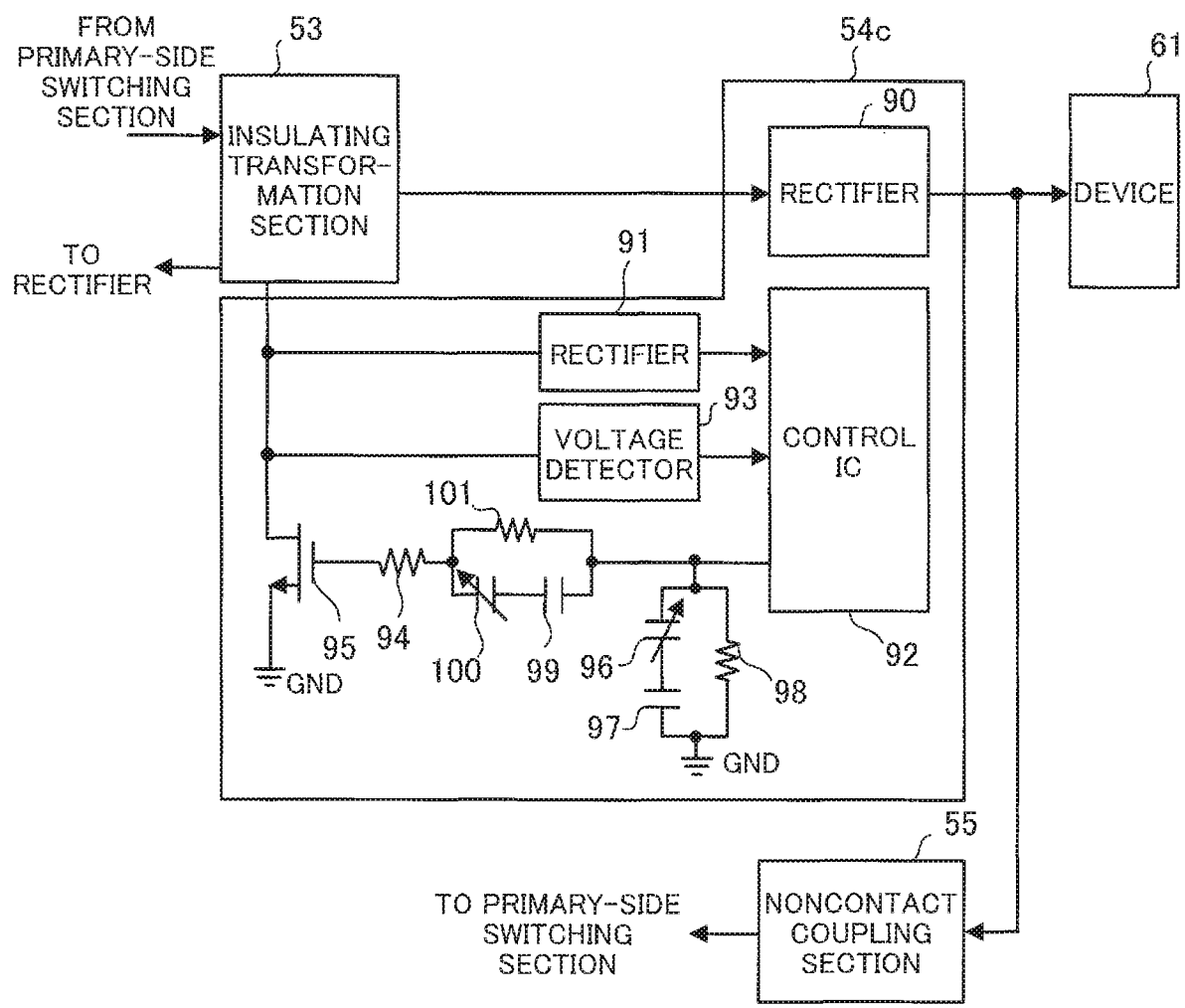
FIG. 14 illustrates an example of a secondary-side switching section of a switching power supply apparatus according to a ninth embodiment.

FIG. 14 illustrates an example of a secondary-side switching section of a switching power supply apparatus according to a ninth embodiment. Components in FIG. 14 which are the same as those of the secondary-side switching section 54a illustrated in FIG. 12 are marked with the same numerals.

A secondary-side switching section 54c includes a resistance element 98 connected in parallel with a circuit including a nonlinear capacitance element 96 and a fixed capacitance element 97 connected in series. Furthermore, a circuit including a fixed capacitance element 99 and a nonlinear capacitance element 100 connected in series is connected to an output terminal of a control IC 92. A resistance element 101 is connected in parallel with the circuit including the fixed capacitance element 99 and the nonlinear capacitance element 100 connected in series.

The resistance element 98 has a resistance value of, for example, 1 to 100 kΩ.

The fixed capacitance element 99 has a capacitance value of, for example, about 10 to 10000 pF.

The nonlinear capacitance element 100 is a pn junction diode, a Schottky diode, or the like having, for example, an on-state voltage of 0.7 to 1.0 V, a reverse breakdown voltage of 10 V or more, and a junction capacitance value Cj of about 10 to 10000 pF.

The resistance element 101 has a resistance value of, for example, 1 to 100 kΩ.

As stated above, the secondary-side switching section 54c includes a parallel circuit including the series circuit made up of the nonlinear capacitance element 96 and the fixed capacitance element 97 connected in series and the resistance element 98 connected in parallel with the series circuit. Furthermore, the secondary-side switching section 54c includes a parallel circuit including the series circuit made up of the nonlinear capacitance element 100 and the fixed capacitance element 99 connected in series and the resistance element 101 connected in parallel with the series circuit. In addition, these two parallel circuits are connected in series.

The adoption of the above structure makes it possible to change a time constant of a transient response of a gate voltage of an FET 95 by changing a resistance value of the resistance element 98, a resistance value of the resistance element 101, a capacitance value of the fixed capacitance element 99, and a junction capacitance value Cj of the nonlinear capacitance element 100.

For example, it is assumed that a transistor having a low threshold voltage (normally-off GaN transistor having a threshold voltage of about 2 V, for example) is used as the FET 95. Although control is exercised so as to put the FET 95 in an off state, the FET 95 may be in an on state by the influence of noise or the like. Accordingly, by changing the above time constant, control is exercised so that a gate voltage of the FET 95 will undershoot to 0 V or less at the time of turning off the FET 95. As a result, the FET 95 is reliably turned off.

In the secondary-side switching section 54c illustrated in FIG. 14, the FETs 95a and 95b in FIG. 13 cascode-connected may be used in place of the FET 95.

(Tenth Embodiment)

By the way, the above circuit for protecting against an overvoltage including the nonlinear capacitance element and the fixed capacitance element connected in series is also applicable to an amplifier.

Figure 15:
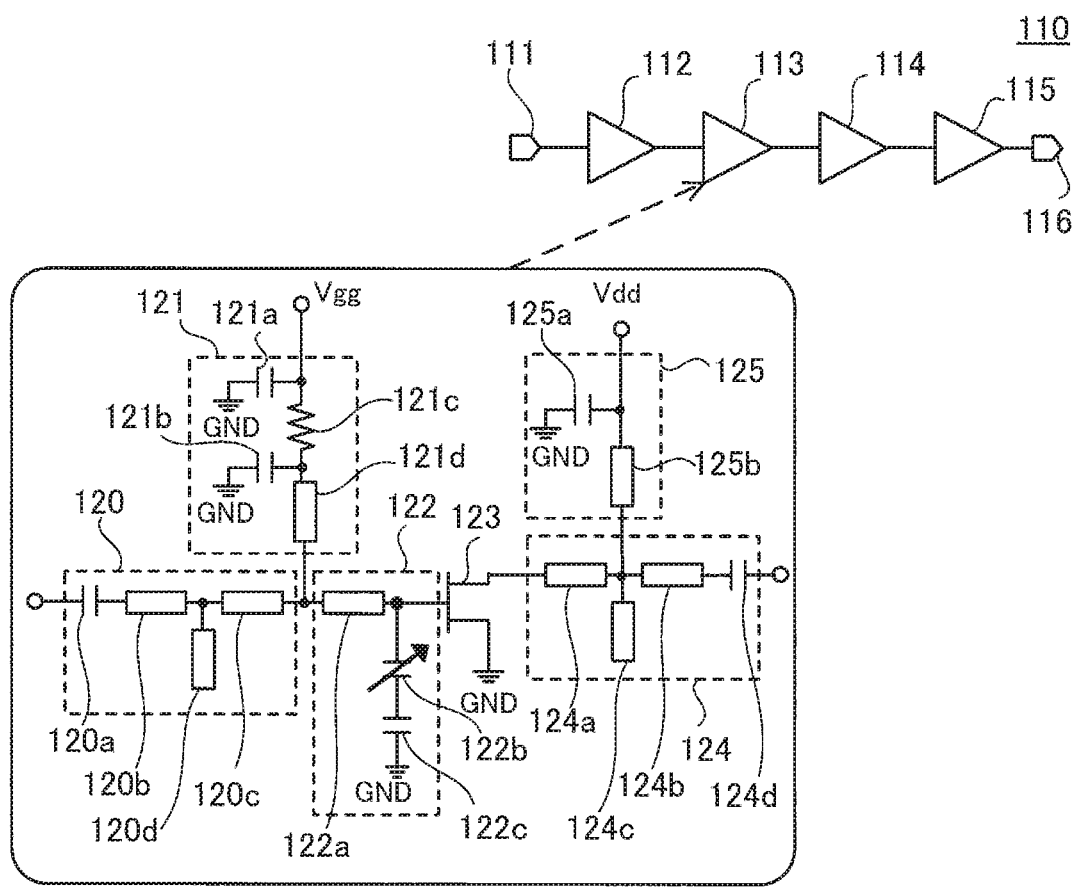
FIG. 15 illustrates an example of an amplifier according to a tenth embodiment.

FIG. 15 illustrates an example of an amplifier according to a tenth embodiment. FIG. 15 illustrates an example of a four-stage amplifier 110.

The four-stage amplifier 110 inputs a signal (high-frequency signal having a frequency of 70 to 90 GHz, for example) from an input terminal 111, amplifies the signal at each stage, that is to say, by each of amplifiers 112, 113, 114, and 115, and outputs it from an output terminal 116. For example, the small signal S-parameter characteristic of each of the amplifiers 112, 113, 114, and 115 is as follows.

Figure 16:
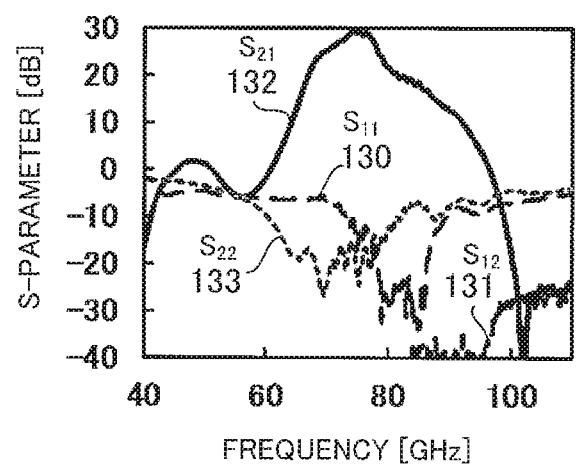
FIG. 16 illustrates an example of the small signal S-parameter characteristic of each amplifier.

FIG. 16 illustrates an example of the small signal S-parameter characteristic of each amplifier. In FIG. 16, a horizontal axis indicates a frequency (GHz) and a vertical axis indicates an S-parameter (dB). A waveform 130 indicates the frequency characteristic of an S-parameter $S_{11}$. A waveform 131 indicates the frequency characteristic of an S-parameter $S_{12}$. A waveform 132 indicates the frequency characteristic of an S-parameter $S_{21}$. A waveform 133 indicates the frequency characteristic of an S-parameter $S_{22}$.

For example, the amplifier 113 included in the four-stage amplifier 110 illustrated in FIG. 15 includes an input matching circuit 120, a bias circuit 121, an input matching circuit 122, an FET 123, an output matching circuit 124, and a bias circuit 125.

The input matching circuit 120 performs matching between the output impedance of the amplifier 112 and the input impedance of the amplifier 113 and includes a capacitance element 120a and inductor elements 120b, 120c, and 120d. An output signal of the amplifier 112 at the preceding stage is supplied to one end of the capacitance element 120a and the other end of the capacitance element 120a is connected to one end of the inductor element 120b. The other end of the inductor element 120b is connected to one end of the inductor element 120c and one end of the inductor element 120d. The other end of the inductor element 120c is connected to the bias circuit 121 and the input matching circuit 122.

The bias circuit 121 generates a bias voltage to be supplied to a gate terminal of the FET 123, and includes capacitance elements 121a and 121b, a resistance element 121c, and an inductor element 121d. A voltage Vgg is supplied to one end of the capacitance element 121a and one end of the resistance element 121c. The other end of the capacitance element 121a is connected to a GND terminal. The other end of the resistance element 121c is connected to one end of the capacitance element 121b and one end of the inductor element 121d. The other end of the capacitance element 121b is connected to the GND terminal. The other end of the inductor element 121d is connected to the other end of the inductor element 120c of the input matching circuit 120.

The input matching circuit 122 performs matching between the output impedance of the amplifier 112 and the input impedance of the amplifier 113 and includes an inductor element 122a, a nonlinear capacitance element 122b, and a fixed capacitance element 122c. One end of the inductor element 122a is connected to the other end of the inductor element 120c and the other end of the inductor element 121d. The other end of the inductor element 122a is connected to the gate terminal of the FET 123 and one end of the nonlinear capacitance element 122b. The other end of the nonlinear capacitance element 122b is connected to one end of the fixed capacitance element 122c. The other end of the fixed capacitance element 122c is connected to the GND terminal.

On the basis of the bias voltage, the FET 123 amplifies and outputs a high-frequency signal supplied to the gate terminal. For example, a high electron mobility transistor (HEMT) made of gallium arsenide and having a gate length of 0.13 μm and a gate width of about 100 μm is used as the FET 123. A drain terminal of the FET 123 is connected to the output matching circuit 124 and a source terminal of the FET 123 is connected to the GND terminal.

The output matching circuit 124 performs matching between the input impedance of the amplifier 114 and the output impedance of the amplifier 113 and includes inductor elements 124a, 124b, and 124c and a capacitance element 124d. One end of the inductor element 124a is connected to the drain terminal of the FET 123 and the other end of the inductor element 124a is connected to one end of the inductor element 124b, one end of the inductor element 124c, and the bias circuit 125. The other end of the inductor element 124b is connected to one end of the capacitance element 124d and the other end of the capacitance element 124d is connected to the amplifier 114 at the next stage.

The bias circuit 125 generates a bias voltage to be supplied to the drain terminal of the FET 123, and includes a capacitance element 125a and an inductor element 125b. A voltage Vdd is supplied to one end of the capacitance element 125a and one end of the inductor element 125b. The other end of the capacitance element 125a is connected to the GND terminal. The other end of the inductor element 125b is connected to the other end of the inductor element 124a of the output matching circuit 124, one end of the inductor element 124b of the output matching circuit 124, and one end of the inductor element 124c of the output matching circuit 124.

The circuit structure of the amplifiers 112, 114, and 115 is the same as that of the amplifier 113.

In the above four-stage amplifier 110, the nonlinear capacitance element 122b corresponds to the nonlinear capacitance element 34 illustrated in FIG. 2. The nonlinear capacitance element 122b is a Schottky diode or the like having, for example, an on-state voltage of about 0.7 to 1 V and a junction capacitance value Cj of about 1 to 100 fF. Furthermore, the fixed capacitance element 122c corresponds to the fixed capacitance element illustrated in FIG. 2. For example, the fixed capacitance element 122c is a capacitance element having a breakdown voltage of about 2 V.

It is assumed that a capacitance value of the nonlinear capacitance element 122b and a capacitance value of the fixed capacitance element 122c are C(V) and Cc respectively. At this time the junction capacitance value Cj and the capacitance value Cc are set so that, for example, the threshold voltage Vth illustrated in FIG. 1 will become a maximum recommended gate input voltage (corresponding to the breakdown voltage of a gate portion) of the FET 123.

With the above four-stage amplifier 110 the nonlinear capacitance element 122b and the fixed capacitance element 122c are included. As a result, if an input voltage of input matching circuit 122 exceeds the threshold voltage Vth, electric charges continue to flow to the fixed capacitance element 122c. Therefore, a gate voltage of the FET 123 is controlled so as not to become an overvoltage. Furthermore, because a resistance component of the fixed capacitance element 122c is small, power loss is suppressed.

One aspect of the protective circuit, the amplifier, and the switching power supply apparatus has been described on the basis of the embodiments. However, these are simple examples and the present invention is not limited to the above description.

According to an aspect, power loss in a protective circuit is suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A protective circuit comprising:
a first capacitance element whose first capacitance value increases with an increase in a first voltage applied to a first terminal of a circuit element;
a second capacitance element connected in series with the first capacitance element between the first terminal and a second terminal, having a second fixed capacitance value which is larger than the first capacitance value until the first voltage reaches a first value, and having a breakdown voltage characteristic higher than a breakdown voltage characteristic of the circuit element, the second terminal being a ground potential terminal;
a first parallel circuit including a first series circuit in which the first capacitance element and the second capacitance element are connected in series and a first resistance element connected in parallel with the first series circuit; and
a second parallel circuit including a second series circuit in which a third capacitance element whose third capacitance value changes according to the first voltage and a fourth capacitance element having a fourth fixed capacitance value are connected in series and a second resistance element connected in parallel with the second series circuit and connected in series with the first parallel circuit.

2. The protective circuit according to claim 1, wherein:
an increase differential of the first capacitance value is higher when the first voltage is higher; and
a combined capacitance value of the first capacitance element and the second capacitance element indicates a voltage characteristic in which the combined capacitance value of the first capacitance element and the second capacitance element converges to the first capacitance value with a decrease in the first voltage and in which the combined capacitance value of the first capacitance element and the second capacitance element converges to the second capacitance value with an increase in the first voltage.

3. The protective circuit according to claim 2, wherein a characteristic of the first capacitance element and the second capacitance value are determined so that a second value of the first voltage corresponds to an upper limit value of the first voltage allowed in the circuit element, the second value being determined based on an inflection point at which the voltage characteristic of the combined capacitance value changes to converge to the second capacitance value as the first voltage increases.

4. An amplifier comprising:
a field-effect transistor which amplifies and outputs, based on a bias voltage, a high-frequency signal supplied to a gate terminal; and
a protective circuit in which a first capacitance element those first capacitance value increases with an increase in gate voltage applied to the gate terminal and a second capacitance element having a second fixed capacitance value which is larger than the first capacitance value until the gate voltage reaches a first value and having a breakdown voltage characteristic higher than a breakdown voltage characteristic of the field-effect transistor are connected in series between the gate terminal and a terminal, the terminal being a ground potential terminal;
wherein the protective circuit includes:
a first parallel circuit including a first series circuit in which the first capacitance element and the second capacitance element are connected in series and a first resistance element connected in parallel with the first series circuit; and
a second parallel circuit including a second series circuit in which a third capacitance element whose third capacitance value changes according to the gate voltage and a fourth capacitance element having a fourth fixed capacitance value are connected in series and a second resistance element connected in parallel with the second series circuit and connected in series with the first parallel circuit.

5. A switching power supply apparatus comprising:
a field-effect transistor which outputs a pulse-wave AC signal by switching operation;
a control circuit which outputs a gate voltage by which the switching operation of the field-effect transistor is controlled; and
a protective circuit in which a first capacitance element whose first capacitance value increases with an increase in the gate voltage and a second capacitance element having a second fixed capacitance value which is larger than the first capacitance value until the gate voltage reaches a first value and having a breakdown voltage characteristic higher than a breakdown voltage characteristic of the field-effect transistor are connected in series between a gate terminal of the field-effect transistor and a terminal, the terminal being a ground potential terminal;
wherein the protective circuit includes:
a first parallel circuit including a first series circuit in which the first capacitance element and the second capacitance element are connected in series and a first resistance element connected in parallel with the first series circuit; and
a second parallel circuit including a second series circuit in which a third capacitance element whose third capacitance value changes according to the gate voltage and a fourth capacitance element having a fourth fixed capacitance value are connected in series and a second resistance element connected in parallel with the second series circuit and connected in series with the first parallel circuit.

* * * * *